United States Patent
Byun

(10) Patent No.: US 10,908,843 B2
(45) Date of Patent: Feb. 2, 2021

(54) MEMORY SYSTEM FOR MANAGING FREE PAGES BASED ON REAL TIME CLOCK AND OPERATING METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 16/435,686

(22) Filed: Jun. 10, 2019

(65) Prior Publication Data

US 2020/0133573 A1  Apr. 30, 2020

(30) Foreign Application Priority Data

Oct. 30, 2018 (KR) .................. 10-2018-0130651

(51) Int. Cl.
  *G06F 3/06* (2006.01)
  *G11C 16/10* (2006.01)

(52) U.S. Cl.
  CPC .......... *G06F 3/0659* (2013.01); *G06F 3/0604* (2013.01); *G06F 3/0673* (2013.01); *G11C 16/10* (2013.01)

(58) Field of Classification Search
  CPC .......... G11C 16/10; G11C 16/105–107; G11C 16/30; G11C 16/34; G06F 3/0604; G06F 3/0659; G06F 3/0673
  See application file for complete search history.

(56) References Cited

U.S. PATENT DOCUMENTS

| 9,081,665 B2 * | 7/2015 | Schuette | G06F 12/0246 |
| 2015/0294724 A1 * | 10/2015 | Nam | G11C 7/14 |
|  |  |  | 365/185.11 |

FOREIGN PATENT DOCUMENTS

| KR | 10-2013-0015643 | 2/2013 |
| KR | 10-2019-0085647 | 7/2019 |

OTHER PUBLICATIONS

Rowan. B.S, Yu. M.M, Sector Write Completion During Emergency Power Off, An IP.com Prior Art Database Technical Disclosure, Apr. 1, 1997 (Year: 1997).*

* cited by examiner

*Primary Examiner* — Khoa D Doan
(74) *Attorney, Agent, or Firm* — IP & T Group LLP

(57) ABSTRACT

A memory system includes a memory device comprising a plurality of memory blocks; and a controller suitable for controlling the memory device, wherein the controller comprises a real time clock (RTC) management circuitry suitable for generating a sudden power-off (SPO) occurrence cycle using first and second RTC values when a first SPO occurs, and then comparing the SPO occurrence cycle to a threshold value to determine whether to delay dummy page generation; and a dummy page generation circuitry suitable for generating a dummy page using one or more free pages or an incomplete program page, excluding valid pages, from a memory block, among the plurality of memory blocks, according to the determination result of the RTC manager, the incomplete program page indicating a page in which a program operation is interrupted due to an SPO.

17 Claims, 17 Drawing Sheets

MEMORY SYSTEM FOR MANAGING FREE PAGES BASED ON REAL TIME CLOCK AND OPERATING METHOD THEREOF

CROSS-REFERENCE TO RELATED APPLICATION

This application claims priority under 35 U.S.C. § 119(a) to Korean Patent Application No. 10-2018-0130651, filed on Oct. 30, 2018, which is incorporated herein by reference in its entirety.

BACKGROUND

1. Field

Various embodiments of the present invention generally relate to a memory device. Particularly, the embodiments relate to a memory system, and an operating method thereof.

2. Discussion of the Related Art

Recently, the paradigm for the computer environment has shifted to ubiquitous computing, which allows computer systems to be used anytime and anywhere. Due to this fact, the use of portable electronic devices, such as mobile phones, digital cameras, and notebook computers has rapidly increased. In general, such portable electronic devices use a memory system which uses a memory device, that is, a data storage device. The data storage device is used as a main memory device or an auxiliary memory device of the portable electronic devices.

SUMMARY

Various embodiments are directed to a memory system capable of minimizing the consumption of free pages, and an operating method thereof.

In accordance with an embodiment of the present invention, a memory device comprising a plurality of memory blocks; and a controller suitable for controlling the memory device, wherein the controller comprises a real time clock (RTC) management circuitry suitable for generating a sudden power-off (SPO) occurrence cycle using first and second RTC values when a first SPO occurs, and then comparing the SPO occurrence cycle to a threshold value to determine whether to delay dummy page generation; and a dummy page generation circuitry suitable for generating a dummy page using one or more free pages or an incomplete program page, excluding valid pages, from a memory block, among the plurality of memory blocks, according to the determination result of the RTC manager, the incomplete program page indicating a page in which a program operation is interrupted due to an SPO.

In accordance with another embodiment of the present invention, a memory system comprising one or more storage devices including one or more processors and a program command executed by at least one of the one or more processors, wherein the one or more storage devices and the program command control the memory system and the one or more processors to: generate a sudden power-off (SPO) occurrence cycle using first and second real time clock (RTC) values when a first SPO occurs; compare the SPO occurrence cycle to a threshold value; delay a dummy page generation time by a first delay time, when the comparison result between the SPO occurrence cycle and the threshold value indicates that the SPO occurrence cycle is less than the threshold value; and generate a dummy page, after the first delay time has elapsed, using one or more free pages or an incomplete program page, excluding valid pages, from a memory block, the incomplete program page indicating a page in which a program operation is interrupted due to an SPO.

In accordance with another embodiment of the present invention, an operating method of a memory system which includes a memory device including a plurality of memory blocks and a controller suitable for controlling the memory device, the operating method comprising: generating a sudden power-off (SPO) occurrence cycle using first and second real time clock (RTC) values when a first SPO occurs, and comparing the SPO occurrence cycle to a threshold value to determine whether to delay dummy page generation; and generating a dummy page using one or more free pages or an incomplete program page, excluding valid pages, from a memory block, among the plurality of memory blocks, according to the result of the determining of whether to delay dummy page generation, the incomplete program page indicating a page in which a program operation is interrupted due to an SPO.

In accordance with another embodiment of the present invention, A memory system comprising: a memory device including a plurality of memory blocks; and a controller suitable for controlling the memory device, the controller comprising: a manager suitable for determining a sudden power-off (SPO) occurrence cycle when an SPO occurs, based on a time value stored in the memory device and a booting time value received from a host, and comparing the SPO occurrence cycle with a threshold value; and a dummy page generator suitable for selectively delaying a dummy page generation time based on the result of the comparing the SPO occurrence cycle with a threshold value, and generating a dummy page at the dummy page generation time.

In accordance with the present embodiment, the memory system can determine whether to generate a dummy page, using a real time clock (RTC), and thus minimize the consumption of free pages.

DETAILED DESCRIPTION

Various embodiments of the invention are described below in more detail with reference to the accompanying drawings. It is noted, however, that the invention may be embodied in different forms. Moreover, aspects and features of the present invention may be configured or arranged differently than shown in the illustrated embodiments. Thus, the present invention is not to be construed as being limited to the embodiments set forth herein. Rather, the described embodiments are provided so that this disclosure is thorough and complete and fully conveys the present invention to those skilled in the art to which this invention pertains. Also, throughout the specification, reference to "an embodiment," "another embodiment" or the like is not necessarily to only one embodiment, and different references to any such phrase are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Various embodiments of the present invention are described in detail below with reference to the attached drawings.

Figure 1:
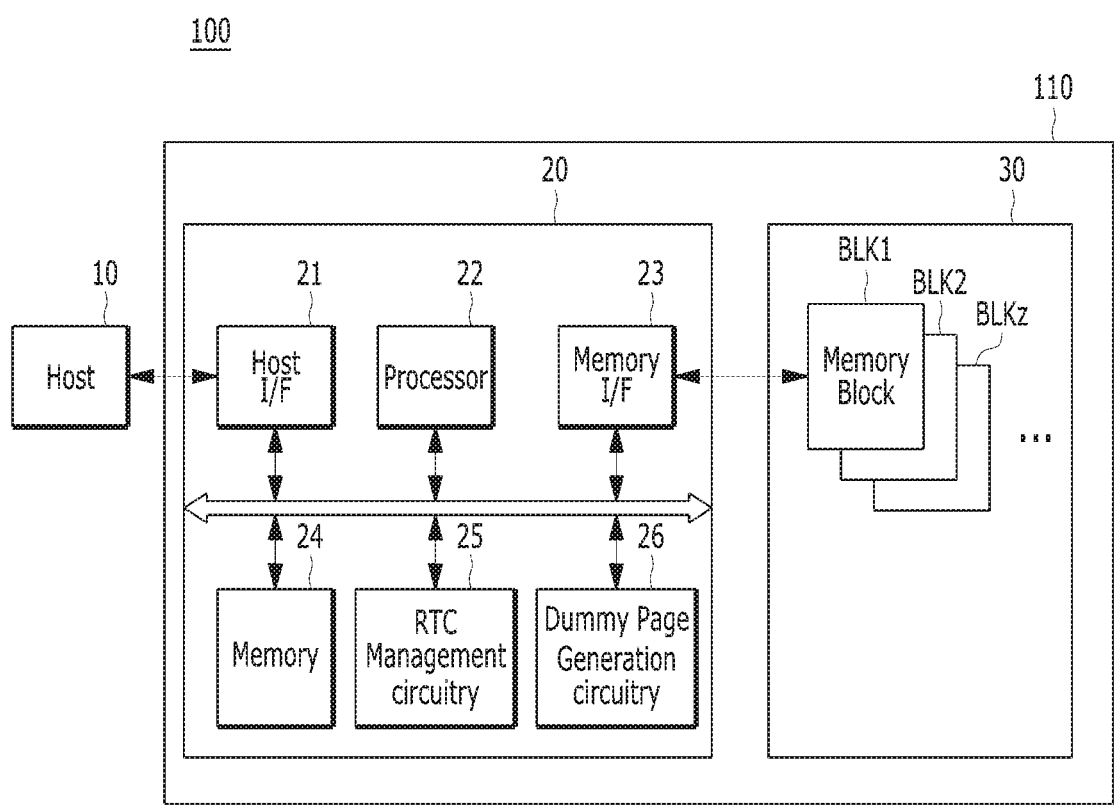
FIG. 1 is a block diagram illustrating a data processing system including a memory system in accordance with an embodiment.

FIG. 1 is a block diagram illustrating a data processing system 100 including a memory system in accordance with an embodiment.

Referring to FIG. 1, the data processing system 100 may include a host 10 and a memory system 110.

The host 10 may be embodied by any of various electronic devices, for example, portable electronic devices, such as a mobile phone, an MP3 player and a laptop computer or electronic devices, such as a desktop computer, a game machine, a television (TV) and a projector, that is, wired and wireless electronic devices.

Also, the host 10 includes at least one operating system (OS). The operating system generally manages and controls the functions and operations of the host 10, and provides interoperability between the host 10 and a user using the data processing system 100 or the memory system 110. The operating system supports functions and operations corresponding to the user's purpose and the use of the operating system. For example, the operating system may be a general operating system or a mobile operating system depending on the mobility of the host 10. The general operating system may be a personal operating system or an enterprise operating system depending on the user's usage environment. For example, the personal operating system configured to support a service providing function for a general user may include Windows and Chrome, and the enterprise operating system configured to secure and support high performance may include Windows server, Linux and Unix. The mobile operating system configured to support a mobility service providing function and a system power saving function to users may include Android, iOS, Windows mobile, etc. The host 10 may include a plurality of operating systems, and executes the operating systems to perform operations with the memory system 110 in correspondence to a user request. The host 10 transmits a plurality of commands corresponding to a user request to the memory system 110, and accordingly, the memory system 110 performs operations corresponding to the commands, that is, operations corresponding to the user request.

The memory system 110 operates in response to a request of the host 10, and, in particular, stores data to be accessed by the host 10. In other words, the memory system 110 may be used as a main memory device or an auxiliary memory device of the host 10. The memory system 110 may be implemented as any of various kinds of storage devices, depending on a host interface protocol which is coupled with the host 10. For example, the memory system 110 may be implemented as any of a solid state driver (SSD), a multi-media card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

Any of the storage devices which implement the memory system 110 may be a volatile memory device, such as a dynamic random access memory (DRAM) and/or a static random access memory (SRAM), or a nonvolatile memory device, such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM) and/or a resistive RAM (RRAM).

The memory system 110 includes a controller 20 and a memory device 30 which stores data to be accessed by the host 10. The controller 20 controls storage of data in the memory device 30.

The controller 20 and the memory device 30 may be integrated into one semiconductor device. For instance, the controller 20 and the memory device 30 may be integrated into one semiconductor device and configure a solid state drive (SSD). In the case where the memory system 110 is used as an SSD, the operating speed of the host 10 which is coupled to the memory system 110 may be improved. The controller 20 and the memory device 30 may be integrated into one semiconductor device to form a memory card, such as a personal computer memory card international association (PCMCIA) card, a compact flash (CF) card, a smart media card (e.g., an SM and an SMC), a memory stick, a multimedia card (e.g., an MMC, an RS-MMC and a micro-MMC), a secure digital card (e.g., an SD, a mini-SD, a micro-SD and an SDHC), and/or a universal flash storage (UFS) device.

In another embodiment, the memory system 110 may be disposed in a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 30 may retain stored data even though power is not supplied. In particular, the memory device 30 stores the data provided from the host 10 through a write operation, and provides stored data to the host 10 through a read operation.

The memory device 30 may include a plurality of memory dies. Each of the plurality of memory dies includes a plurality of planes. The plurality of memory planes include a plurality of memory blocks BLK1 to BLKz, each of which includes a plurality of pages. Each of the pages includes a plurality of memory cells to which a plurality of word lines (WL) are coupled. The memory device 30 may be a non-volatile memory device, for example, a flash memory. The flash memory may have a three-dimensional (3D) stack structure.

The controller 20 controls the memory device 30 in response to a request from the host 10. For example, the controller 20 provides the data read from the memory device 30, to the host 10, and stores the data provided from the host 10, in the memory device 30. To this end, the controller 20 controls the operations of the memory device 30, such as read, write, program and erase operations.

The controller 20 includes a host interface (I/F) 21, a processor 22, a memory interface (I/F) 23, a memory 24, a real time clock (RTC) management circuitry 25 and a dummy page generation circuitry 26.

The host interface 21 processes the commands and data of the host 10, and may be configured to communicate with the host 10 through at least one of various interface protocols, such as universal serial bus (USB), multimedia card (MMC), peripheral component interconnect express (PCI-e or PCIe), serial attached SCSI (SAS), serial advanced technology attachment (SATA), parallel advanced technology attachment (DATA), small computer system interface (SCSI), enhanced small disk interface (ESDI), integrated drive electronics (IDE) and mobile industry processor interface (MIDI). The host interface 32 may be driven through firmware referred to as a host interface layer (HIL), which is a region which exchanges data with the host 10.

The memory interface 23 serves as a memory and storage interface which performs interfacing between the controller 20 and the memory device 30 to allow the controller 20 to control the memory device 30 in response to a request from the host 10. The memory interface 23 generates control signals for the memory device 30 and processes data according to the control of the processor 22, as a NAND flash controller (NFC) in the case where the memory device 30 is a flash memory, in particular, in the case where the memory device 30 is a NAND flash memory. The memory interface 23 may support the operation of an interface which processes a command and data between the controller 20 and the memory device 30, for example, a NAND flash interface, in particular, data input/output between the controller 20 and the memory device 30. The memory interface 23 may be driven through firmware referred to as a flash interface layer (FIL), which is a region which exchanges data with the memory device 30.

The memory 24, as the working memory of the memory system 110 and the controller 20, stores data for driving of the memory system 110 and the controller 20. For example, when the controller 20 controls the memory device 30 in response to a request from the host 10, the controller 20 may provide data read from the memory device 30 to the host 10, and/or store data provided from the host 10 in the memory device 30. To this end, when the controller 20 controls the operations of the memory device 30, such as read, write, program and erase operations, the memory 24 stores data needed to allow such operations to be performed by the memory system 110, that is, between the controller 20 and the memory device 30.

The memory 24 may be realized by a volatile memory. For example, the memory 24 may be realized by a static random access memory (SRAM) or a dynamic random access memory (DRAM). As shown in FIG. 1, the memory 24 may be disposed within the controller 20. Alternatively, the memory 24 may be external to the controller 20, and in this regard, may be realized as a separate external volatile memory in communication with the controller 20 through a memory interface.

As described above, the memory 24 stores data needed to perform data read and write operations between the host 10 and the memory device 30 and data when performing the data read and write operations. For such data storage, the memory 24 includes a program memory, a data memory, a write buffer/cache, a read buffer cache, a data buffer/cache, a map buffer/cache, and the like.

The processor 22 controls all operations of the memory system 110, and in particular, controls a program operation or a read operation for the memory device 30, in response to a write request or a read request from the host 10. The processor 22 drives firmware referred to as a flash translation layer (FTL), to control the general operations of the memory system 110. The processor 22 may be realized by a microprocessor or a central processing circuitry (CPU).

For instance, the controller 20 performs an operation, requested by the host 10, in the memory device 30. That is, the controller 20 performs a command operation corresponding to a command received from the host 10, with the memory device 30, through the processor 22. The controller 20 may perform a foreground operation as a command operation corresponding to a command received from the host 10. For example, the controller 20 performs a program operation corresponding to a write command, a read operation corresponding to a read command, an erase operation corresponding to an erase command or a parameter set operation corresponding to a set parameter command or a set feature command as a set command.

The controller 20 may also perform a background operation for the memory device 30, through the processor 22. The background operation includes an operation of copying the data stored in one memory block, among the memory blocks BLK1 to BLKz of the memory device 30, to another memory block. Such a background operation may be a garbage collection (GC) operation, an operation of swapping data among select memory blocks BLK1 to BLKz, e.g., a wear leveling (WL) operation, an operation of storing map data stored in the controller 20 in the memory blocks BLK1 to BLKz, e.g., a map flush operation, or an operation of performing bad block management for the memory device 30, for example, an operation of identifying and processing a bad block among the memory blocks BLK1 to BLKz in the memory device 30.

The processor 134 may drive the RTC management circuitry 25 and the dummy page generation circuitry 26, when a sudden power-off (SPO) occurs.

Figure 2A:
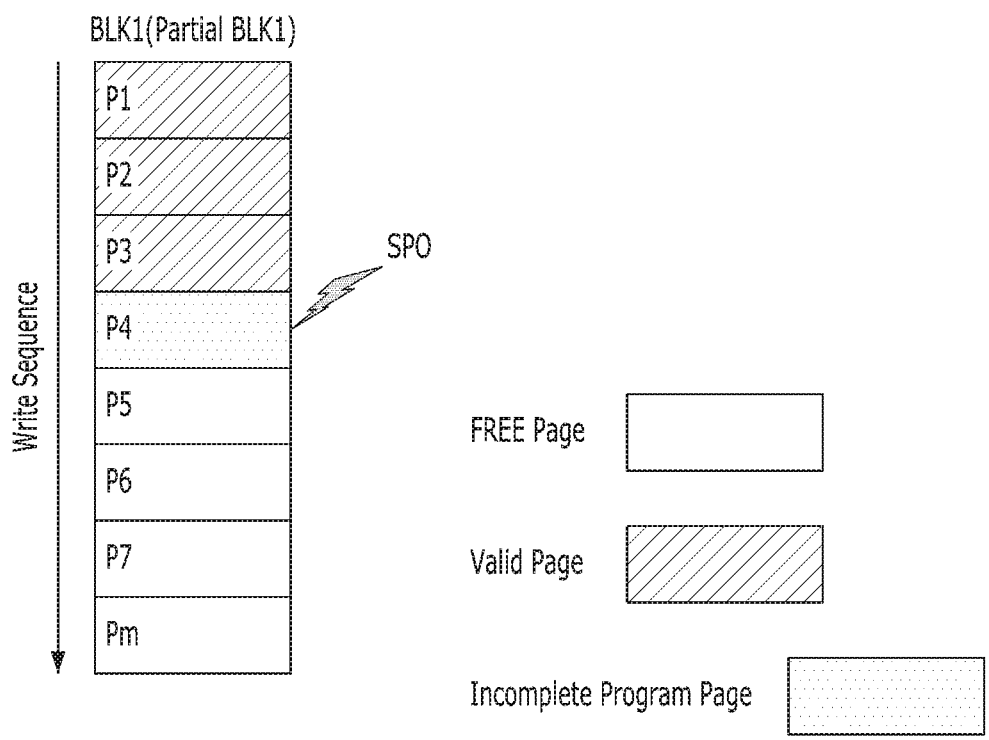
FIG. 2A and FIG. 2B are diagrams schematically illustrating an example of a general dummy page generating operation.
Figure 2B:
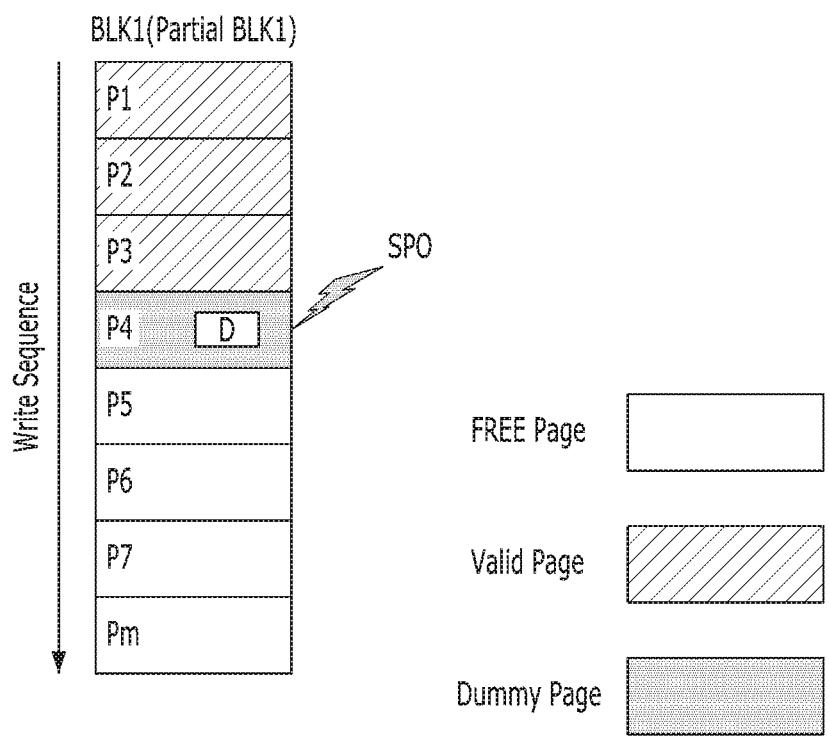

Before the RTC management circuitry 25 and the dummy page generation circuitry 26 are described, the following case will be described with reference to FIGS. 2A and 2B.

In general, when an unexpected power cut-off, i.e., SPO, occurs while the memory controller 20 sequentially performs a program operation on first to $m^{th}$ pages P1 to Pm of the memory block BLK1 in response to a write command received from the host 10, the program operation may be forcibly suspended. The SPO may indicate a sudden power loss. For example, an external power-off due to an unexpected power fail may cause the SPO. In the memory device 30, the block in which the program operation is suspended due to the SPO may be referred to as a partial block. The partial block may indicate a block in which some but not all pages are programmed. For example, referring to FIG. 2A, when an SPO occurs while a fourth page P4 of a first memory block BLK1 included in the memory device 30 is programmed, the fourth page P4 may not be properly programmed. In this case, a first incomplete program page may be generated. That is, the incomplete program page indicates a page in which a program operation is interrupted due to an SPO, and the first memory block BLK1 may be a first partial block. Referring to FIG. 2B, when the memory system 110 is powered on, the memory controller 20 may decide whether the first partial block BLK1 is programmed, and generate a dummy page P4 by performing a dummy program operation on one or more free pages or the first incomplete program page of the partial block. In other words, the dummy page may be generated using one or more free pages or incomplete program pages for the memory block BLK1. As such, when a dummy page is generated whenever the SPO occurs, free pages may be consumed as the dummy page. In order to minimize dummy page generation, the memory controller 20 may use the RTC management circuitry 25 and the dummy page generation circuitry 26.

The RTC management circuitry 25 may check an SPO occurrence cycle generated through a real time clock (RTC), and compare the SPO occurrence cycle to a threshold value TH in order to determine whether to generate a dummy page. The SPO occurrence cycle may indicate a difference between a first RTC value RTC_1 and a second RTC value RTC_2. The first RTC value RTC_1 may be generated through the RTC when a second SPO SPO_2 occurred before a current first SPO SPO_1. The second RTC value RTC_2 may be generated through the RTC when the first SPO SPO_1 occurs. The threshold value TH may indicate a set value which may be changed as a workload is changed depending on a change in user environment. The set value may be applied in consideration of service environment and performance.

According to the determination result of the RTC manager 25, the dummy page generation circuitry 26 may generate a dummy page by performing a dummy program operation to program one or more pages with dummy data.

In this context, the RTC management circuitry 25 and the dummy page generation circuitry 26 are described in detail.

As used in the disclosure, the term 'circuitry' can refer to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/ software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to a particular claim element, an integrated circuit for a storage device.

Figure 3:
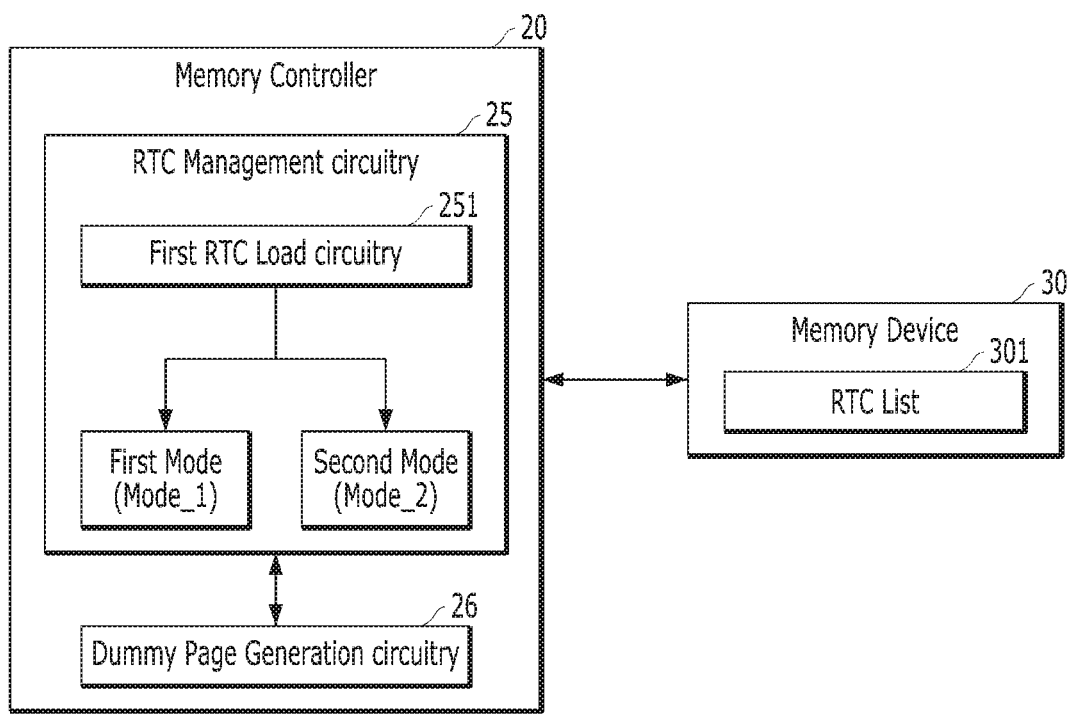
FIG. 3 is a diagram schematically illustrating an example of a data processing operation of a memory device in a memory system in accordance with an embodiment.

FIG. 3 is a diagram for schematically illustrating an example of a data processing operation of a memory device in a memory system in accordance with an embodiment.

Referring to FIG. 3, the controller 20 may drive the RTC management circuitry 25 and the dummy page generation circuitry 26 through a processor, when an SPO occurs.

When the memory system 110 is powered on after the SPO occurred, the first RTC load circuitry 251 may load the first RTC value RTC_1 from an RTC list 301 of the memory device 30. The RTC list 301 may be stored in any one memory block of a plurality of memory blocks. RTC indexes INDEX and RTC values may be sequentially stored in the RTC list 301. The first RTC value may indicate the RTC value which is last stored among one or more RTC values stored in the RTC list 301. Depending on whether the first RTC value is loaded through the first RTC load circuitry 251, a first or second mode Mode_1 or Mode_2 may be performed.

When the first mode Mode_1 is performed, a second RTC generation circuitry 252 may be driven. That is, the first mode Mode_1 may be performed when the first RTC value cannot be loaded from the RTC list 301. Specifically, when no RTC values are stored in the RTC list 301 because the SPO occurred for the first time, the second RTC generation circuitry 252 may be driven. This case will be described in detail with reference to FIGS. 4A and 4B.

On the other hand, when the second mode Mode_2 is performed, the second RTC generation circuitry 252, a comparison circuitry 253 and a time delay circuitry 254 may be driven. That is, when the second mode Mode_2 is performed, it may indicate that the first RTC value can be loaded from the RTC list 301 because two or more SPOs occurred. This case will be described in detail with reference to FIGS. 5A to 5C.

Figure 4A:
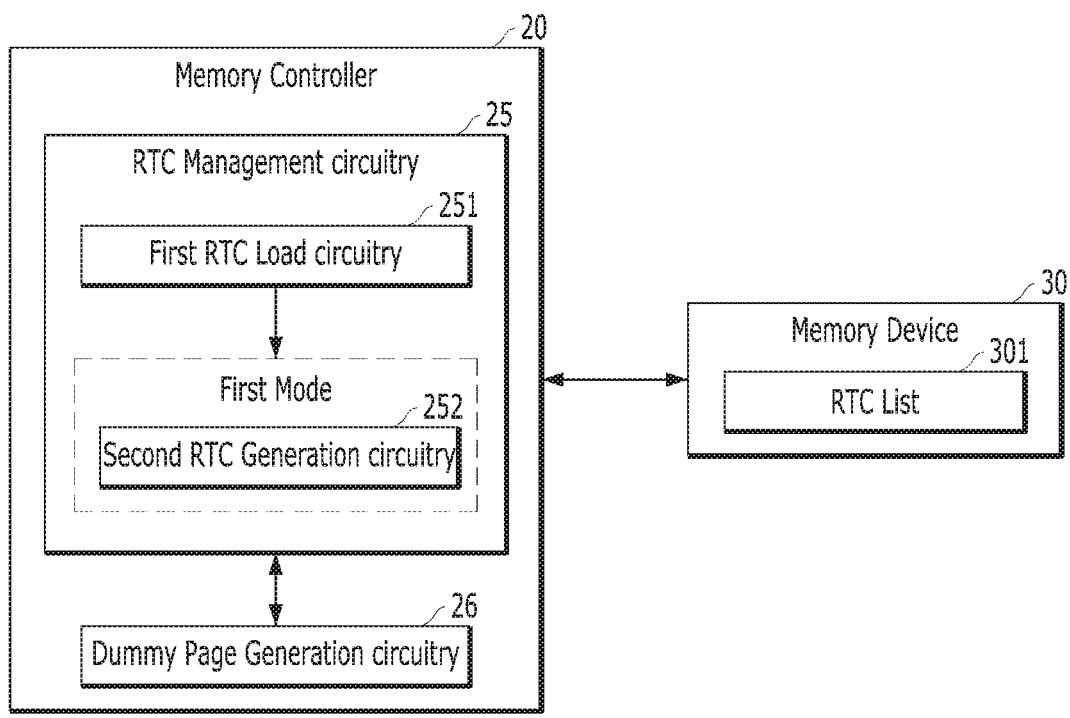
FIGS. 4A and 4B are diagrams schematically illustrating an example of a first mode operation in a memory system in accordance with an embodiment.
Figure 4B:
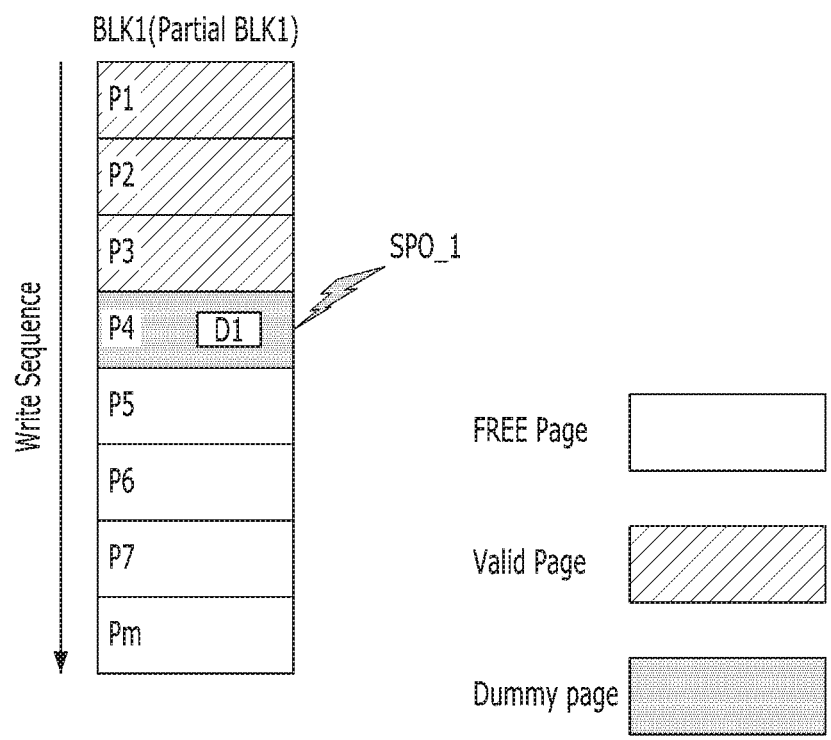

FIGS. 4A and 4B are diagrams schematically illustrating an example of a first mode operation (e.g., the first mode Mode_1 of FIG. 3) in a memory system in accordance with an embodiment.

Referring to FIGS. 4A and 4B, the first mode Mode_1 may include the second RTC generation circuitry 252. The second RTC generation circuitry 252 may generate a second RTC value RTC_2 corresponding to a first SPO occurrence time. Then, the second RTC generation circuitry 252 may store the generated second RTC value RTC_2 in the RTC list 301 of the memory device 30. The second RTC value RTC_2 may indicate an RTC value which is generated at the time at which an SPO occurs.

Specifically, when the memory system 110 is powered on or booting is started, the second RTC generation circuitry 252 may receive a first booting time value BTV indicating the booting time from the host 10. The second RTC generation circuitry 252 may generate the second RTC value RTC_2 indicating the first SPO occurrence time in response to the received first booting time value BTV. The second RTC generation circuitry 252 may store the generated second RTC value RTC_2 in the RTC list 301.

Then, the dummy page generation circuitry 26 may be driven after the second RTC value RTC_2 was generated through the second RTC generation circuitry 252. The dummy page generation circuitry 26 may generate a dummy page by performing a dummy program operation to program one or more pages with dummy data.

Referring to FIG. 4B, the dummy page generation circuitry 26 may generate a first dummy page D1 by performing a dummy program operation on a fourth page P4 of the plurality of pages P1 to Pm included in the first partial block BLK1.

Figure 5A:
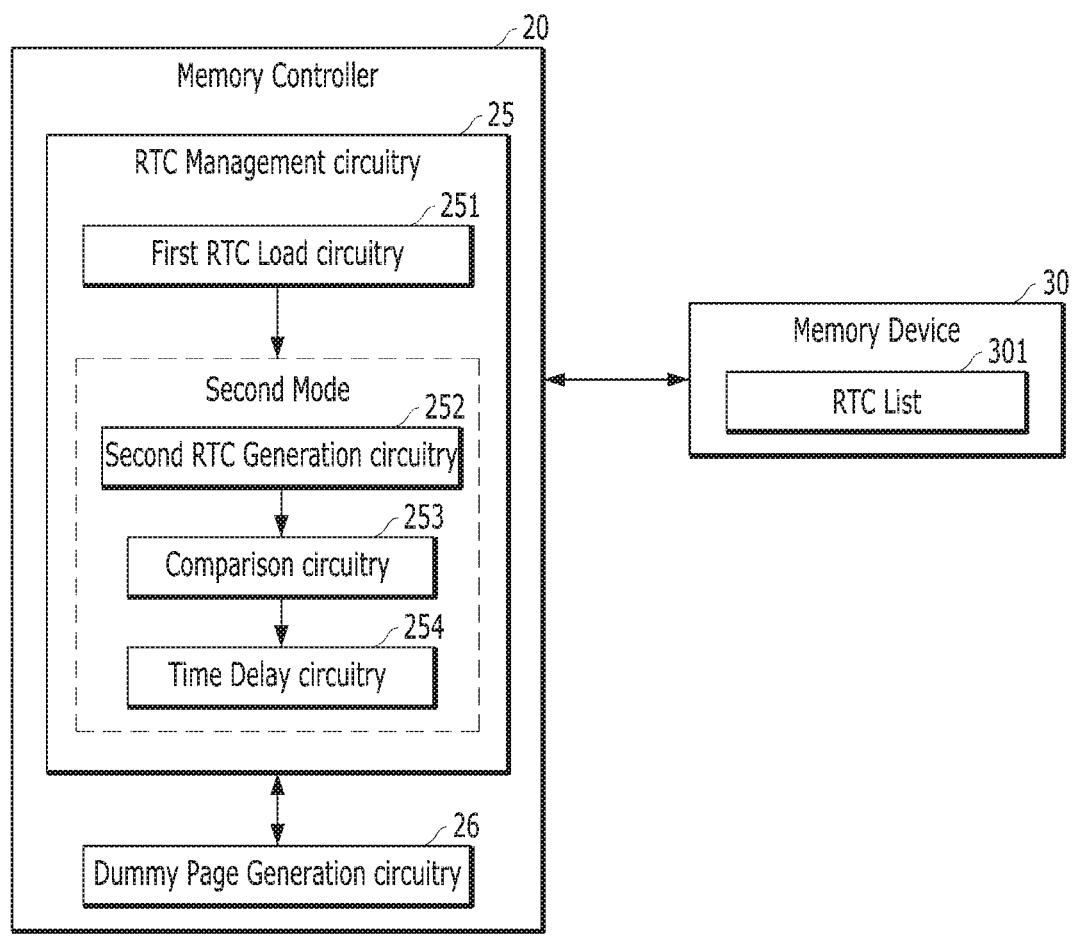
FIGS. 5A to 5C are diagrams schematically illustrating an example of a second mode operation in a memory system in accordance with an embodiment.
Figure 5B:
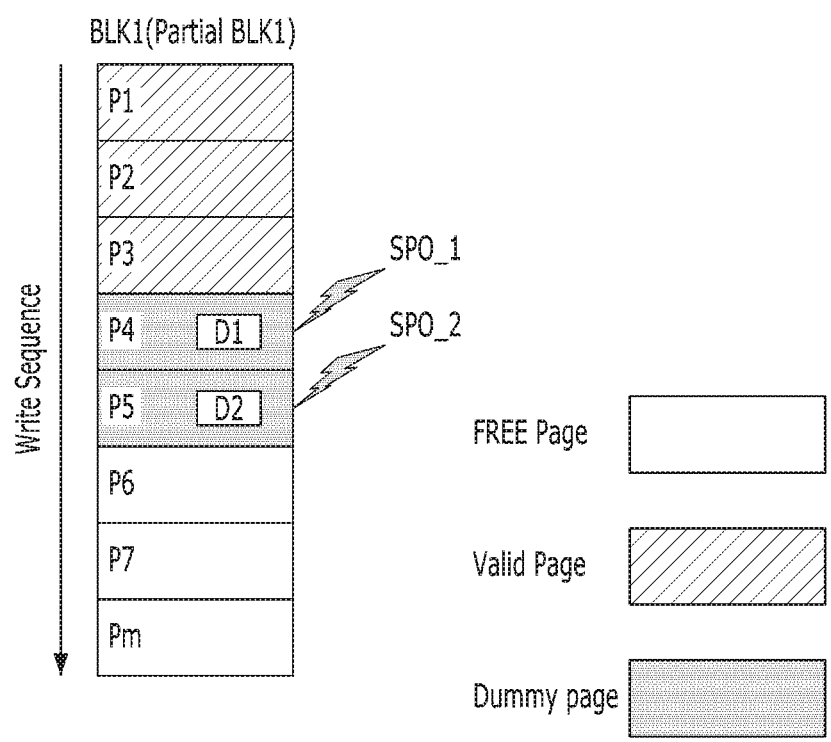
Figure 5C:
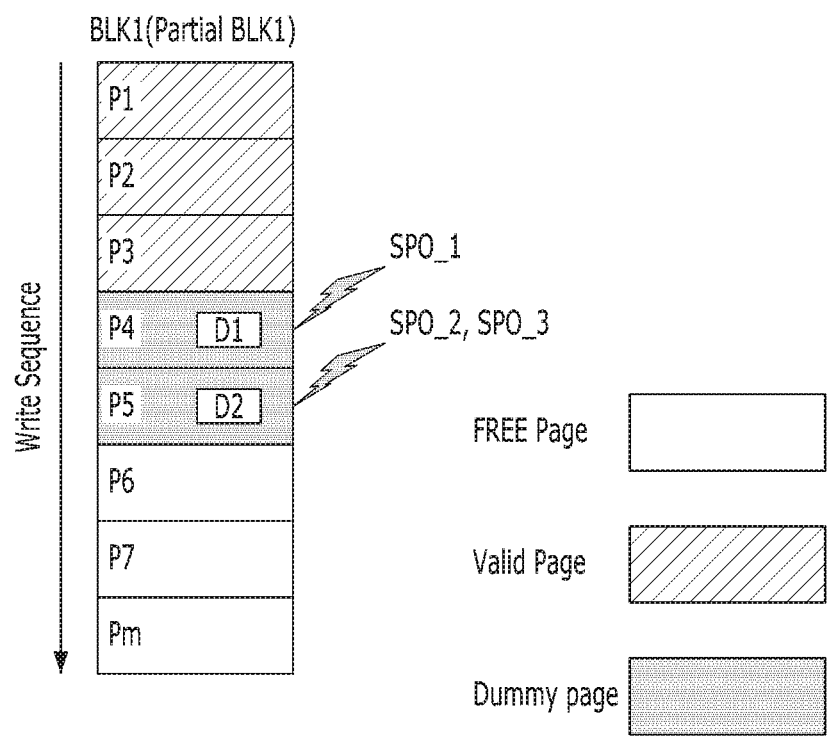

FIGS. 5A to 5C are diagrams schematically illustrating an example of a second mode operation (e.g., the second mode Mode_2 of FIG. 3) in a memory system in accordance with an embodiment.

Referring to FIGS. 5A to 5C, the second mode Mode_2 may be driven when the first RTC value can be loaded through the first RTC load circuitry 251 because one or more RTC values are stored in the RTC list 301.

The second mode Mode_2 may be driven through the second RTC generation circuitry 252, the comparison circuitry 253 and the time delay circuitry 254. The second RTC generation circuitry 252 may generate the second RTC value RTC_2 corresponding to a second SPO occurrence time. Then, the second RTC generation circuitry 252 may store the generated second RTC value RTC_2 in the RTC list 301. The second RTC value RTC_2 may indicate an RTC value which is generated when an SPO occurs at the moment. Specifically, when the memory system 110 is powered on or booting is started, the second RTC generation circuitry 252 may receive a second booting time value BTV indicating the booting time from the host 10. The second RTC generation circuitry 252 may generate the second RTC value RTC_2 indicating the second SPO occurrence time in response to the received second booting time value BTV. The second RTC generation circuitry 252 may store the generated second RTC value RTC_2 in the RTC list 301. Then, the second RTC generation circuitry 252 may transfer the second RTC value RTC_2 to the comparison circuitry 253.

The comparison circuitry 253 may calculate a first SPO occurrence cycle through a difference between the first RTC value RTC_1 received from the first RTC load circuitry 251 and the second RTC value RTC_2 received from the second RTC generation circuitry 252. The comparison circuitry 253 may compare the first SPO occurrence cycle to an set threshold value TH, and determine whether an SPO is likely to occur.

When the comparison result between the threshold value TH and the first SPO occurrence cycle indicates that the first SPO occurrence cycle is greater than the threshold value TH, the comparison circuitry 253 may determine that an SPO is less likely to occur, and a dummy page generation time may not be generated through the time delay circuitry 254, but a second dummy page may be generated through the dummy page generation circuitry 26. That is, as illustrated in FIG. 5B, the second dummy page D2 may be generated through the dummy page generation circuitry 26.

On the other hand, when the comparison result between the threshold value TH and the first SPO occurrence cycle indicates that the first SPO occurrence cycle is less than the threshold value TH, the comparison circuitry 253 may determine that an SPO is highly likely to occur. That is, the comparison circuitry 253 may determine that an SPO will occur soon. According to the determination result, the time delay circuitry 254 may be driven to delay the dummy page generation time.

The time delay circuitry 254 may delay the dummy page generation time by an set first delay time DT1. The reason to delay the dummy page generation time by the first delay time DT1 is because a third SPO is likely to occur during the first delay time DT1. For example, when the third SPO occurs during the first delay time DT1, no dummy page needs to be generated. Since the generating of the dummy page does not need to be performed even though several SPOs occur during the first delay time DT1, the consumption of free pages may be minimized.

The dummy page generation circuitry 26 may generate a dummy page by performing the dummy program operation to program one or more pages with dummy data. Referring to FIG. 5C, when the third SPO occurs during the first delay time DT1 after the second SPO SPO_2 occurred, the dummy page generation circuitry 26 may generate the second dummy page by performing the dummy program operation only on a fifth page P5 of the plurality of pages P1 to Pm included in the first partial block BLK1. That is, although three SPOs occurred SPO_1 to SPO_3, only two dummy pages D1 and D2 may be generated.

While the time delay circuitry 254 delays the dummy page generation time by the set first delay time DT1, the third SPO SPO_3 may not occur. In this case, the second dummy page D2 may be generated through the dummy page generation circuitry 26. That is, as described with reference to FIG. 5B, the second dummy page D2 may be generated through the dummy page generation circuitry 26.

Figure 6:
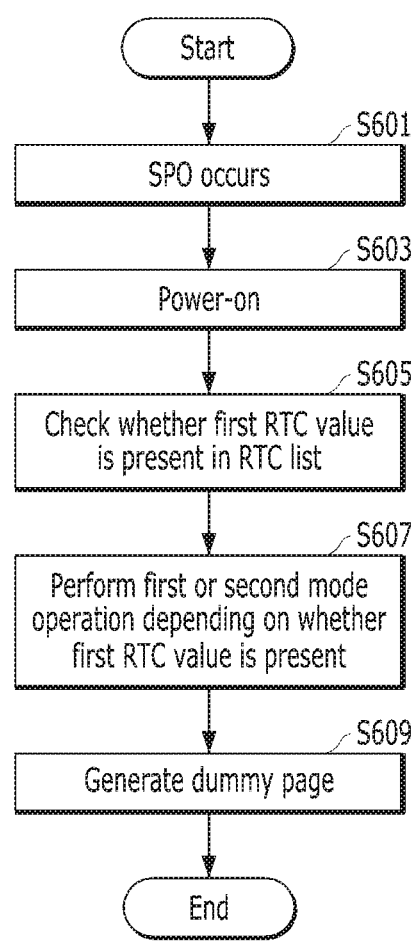
FIGS. 6 to 8 are flowcharts illustrating an example of an operating method of a memory system in accordance with an embodiment.
Figure 7:
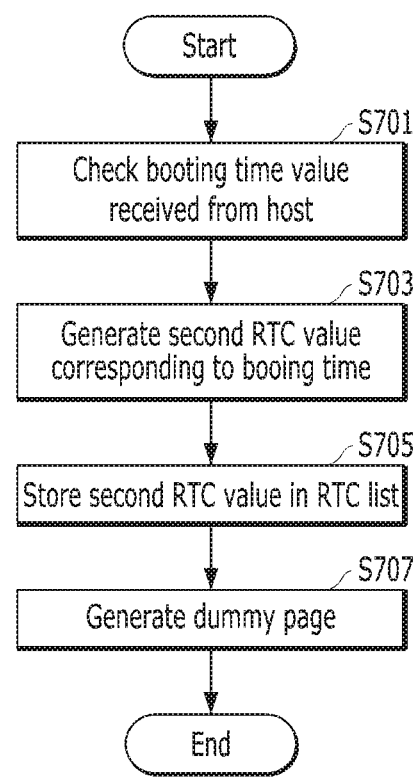
Figure 8:
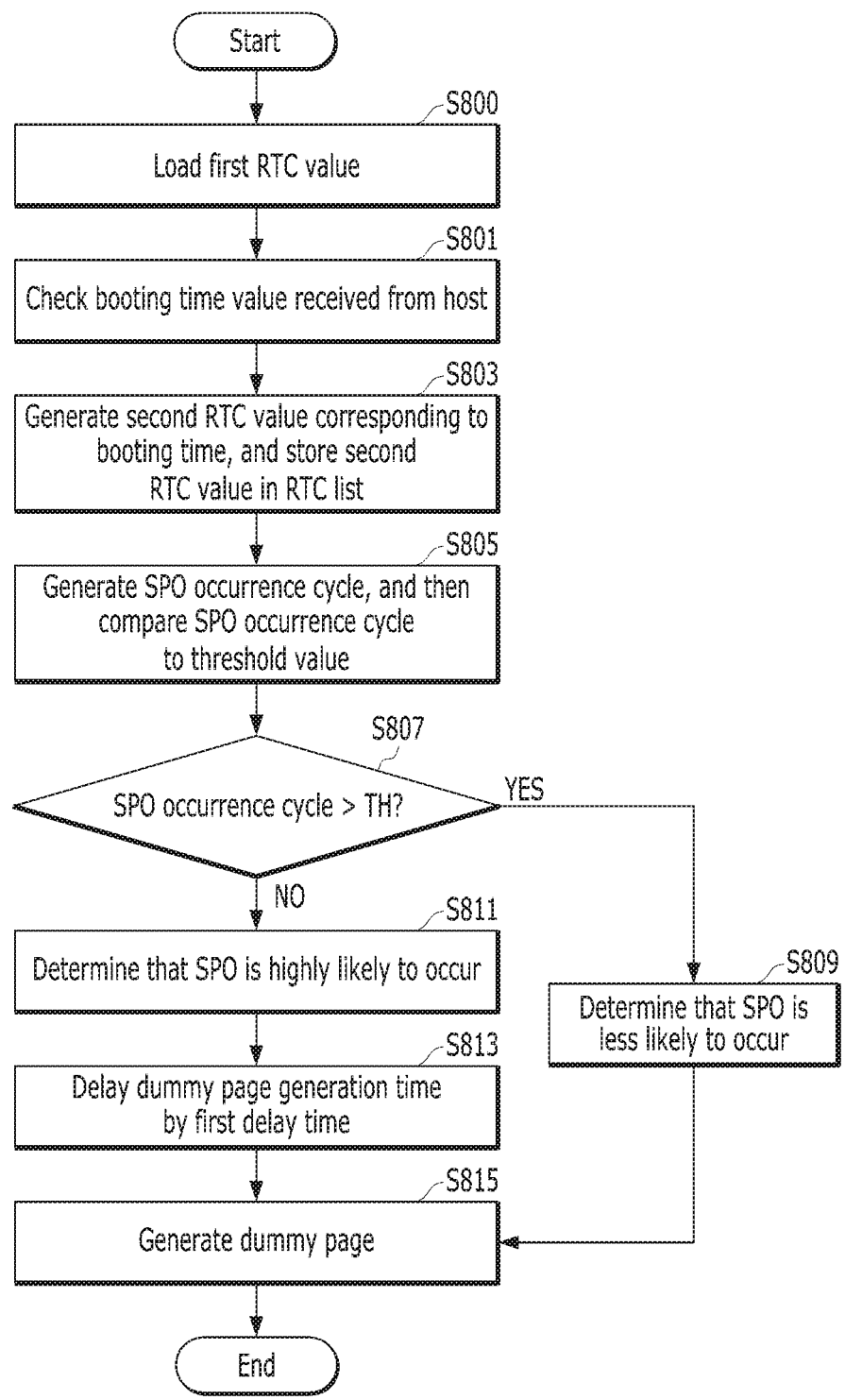

FIGS. 6 to 8 are flowcharts illustrating an example of an operating method of a memory system (e.g., the memory system 110 of FIG. 1) in accordance with embodiments.

Referring to FIG. 6, at step S601, the memory system 110 may sense a sudden power off (SPO). For example, the memory system 110 may directly sense disconnection of power provided from the processor 22 or from an external source. Alternatively, the memory system 110 may receive a save signal SAVE_n (not illustrated) from the processor 22, and sense the condition of the SPO based on the received save signal SAVE_n. Then, after the SPO occurred, at step S603, the memory system 110 may be powered on.

At step S605, the RTC management circuitry 25 may load the first RTC value RTC_1 from the RTC list 301 of the memory device 30. The RTC list 301 may be stored in any memory block of the plurality of memory blocks. RTC indexes INDEX and RTC values may be sequentially stored in the RTC list 301. The first RTC value RTC_1 may be the last stored among the RTC value(s) stored in the RTC list 301. Depending on whether the first RTC value RTC_1 is loaded, the RTC management circuitry 25 may be driven in the first or second mode Mode_1 or Mode_2.

When the RTC management circuitry 25 is driven in the first mode Mode_1, the second RTC generation circuitry 252 may be driven. That is, the RTC management circuitry 25 may be driven in the first mode Mode_1, when the first RTC value RTC_1 cannot be loaded from the RTC list 301. Specifically, when no RTC values are stored in the RTC list 301 because the SPO occurred for the first time, the second RTC generation circuitry 252 may be driven. This case will be described in detail with reference to FIG. 7.

On the other hand, when the RTC management circuitry 25 is driven in the second mode Mode_2, it may indicate that the first RTC value RTC_1 can be loaded from the RTC list 301 because two or more SPOs occurred. This case will be described in detail with reference to FIG. 8.

At step S609, the RTC management circuitry 25 may generate a dummy page after performing the operation in the first or second mode.

FIG. 7 is a flowchart illustrating a first mode operation method of a memory system (e.g., the memory system 110 of FIG. 1) in accordance with an embodiment.

Referring to FIG. 7, when the memory system 110 is powered on or booting is started, the RTC management circuitry 25 may receive a first booting time value BTV indicating the booting time from the host 10 at step S701.

At step S703, the RTC management circuitry 25 may generate a second RTC value RTC_2 indicating a first SPO occurrence time in response to the received first booting time value BTV.

At step S705, the RTC management circuitry 25 may store the generated second RTC value RTC_2 in the RTC list 301 of the memory device 30.

At step S707, the RTC management circuitry 25 may generate a dummy page by performing a dummy program operation to program one or more pages with dummy data through the dummy page generation circuitry 26, after the second RTC value RTC_2 was generated through the second RTC generation circuitry.

FIG. 8 is a flowchart illustrating a second mode operation method of a memory system (e.g., the memory system 110 of FIG. 1) in accordance with an embodiment.

Referring to FIG. 8, at step S800, the RTC management circuitry 25 may load the first RTC value RTC_1, which is last saved, from the RTC list 301 of the memory device 30.

At step S801, the RTC management circuitry 25 may receive a second booting time value BTV indicating a booting time from the host 10.

At step S803, the RTC management circuitry 25 may generate a second RTC value RTC_2 indicating a second SPO occurrence time in response to the received second booting time value BTV. Then, the RTC management circuitry 25 may save the generated second RTC value RTC_2 in the RTC list 301.

At step S805, the RTC management circuitry 25 may calculate a first SPO occurrence cycle through a difference between the first RTC value RTC_1 and the second RTC value RTC_2. Then, the RTC management circuitry 25 may compare the first SPO occurrence cycle to set threshold value TH in order to determine whether an SPO is likely to occur.

When the comparison result between the threshold value TH and the first SPO occurrence cycle indicates that the first SPO occurrence cycle is greater than the threshold value TH (YES at step S807), at step S809, the RTC management circuitry 25 may determine that an SPO is less likely to occur, and not delay a dummy page generation time.

At step S815, after step S809, the dummy page generation circuitry 26 may generate a second dummy page by performing a dummy program operation to program one or more pages with dummy data.

On the other hand, when the comparison result between the threshold value TH and the first SPO occurrence cycle indicates that the first SPO occurrence cycle is less than the threshold value TH (NO at step S807), at step S811, the RTC management circuitry 25 may determine that an SPO is highly likely to occur. That is, the RTC management circuitry 25 may determine that an SPO will occur soon.

At step S813, the RTC management circuitry 25 may delay the dummy page generation time by a set first delay time DT1. The reason to delay the dummy page generation time by the first delay time is because a third SPO is likely to occur during the first delay time. For example, when the third SPO occurs during the first delay time, no dummy page needs to be generated. Since the generating of the dummy page does not need to be performed even though several SPOs occur during the first delay time, the consumption of free pages may be minimized.

At step S815, the dummy page generation circuitry 26 may generate a dummy page by performing a dummy program operation to program one or more pages with dummy data. For example, when the third SPO occurs during the first delay time after the second SPO occurred, the dummy page generation circuitry 26 may generate the second dummy page by performing a dummy program operation only on the fifth page of the plurality of pages included in the first partial block. That is, although three SPOs occurred, only two dummy pages may be generated.

With reference to FIGS. 9 to 17, a data processing system and electronic appliances, to which the memory system 110 including the memory device 30 and the controller 20 described above, may be applied, in accordance with embodiments, are described.

FIGS. 9 to 17 are diagrams illustrating exemplary applications of memory systems in accordance with embodiments of the present invention.

Figure 9:
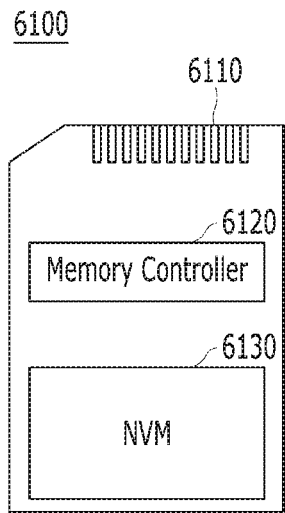
FIGS. 9 to 17 are diagrams illustrating exemplary applications of memory systems in accordance with embodiments of the present invention.

FIG. 9 is a diagram illustrating a data processing system including a memory system in accordance with an embodiment. FIG. 9 illustrates a memory card system 6100 to which the memory system is applied.

Referring to FIG. 9, the memory card system 6100 includes a connector 6110, a memory controller 6120 and a memory device 6130.

The memory controller 6120 is connected with, for access to, the memory device 6130, which is implemented as a nonvolatile memory (NVM). For example, the memory controller 6120 controls the read, write, erase and background operations of the memory device 6130. The memory controller 6120 provides an interface between the memory device 6130 and a host (not shown), and drives firmware for controlling the memory device 6130. That is to say, the memory controller 6120 may correspond to the controller 20 in the memory system 110 described above with reference to FIG. 1, and the memory device 6130 may correspond to the memory device 30 in the memory system 110 described above with reference to FIG. 1.

Therefore, the memory controller 6120 may include components, such as a random access memory (RAM), a processor, a host interface, a memory interface and an error correction component.

The memory controller 6120 may communicate with an external device, for example, the host 10 described above with reference to FIG. 1, through the connector 6110. For example, as described above with reference to FIG. 1, the memory controller 6120 may be configured to communicate with the external device through at least one of various communication protocols, such as universal serial bus (USB), multimedia card (MMC), embedded MMC (eMMC), peripheral component interconnection (PCI), PCI express (PCIe), advanced technology attachment (ATA), serial ATA, parallel ATA, small computer system interface (SCSI), enhanced small disk interface (ESDI), integrated drive electronics (IDE), Firewire, universal flash storage (UFS), WiFi or Wi-Fi and Bluetooth. Accordingly, the memory system and the data processing system in accordance with an embodiment may be applied to wired and/or wireless electronic appliances, particularly a mobile electronic appliance.

The memory device 6130 may be implemented by a nonvolatile memory, such as an electrically erasable and programmable ROM (EPROM), a NAND flash memory, a NOR flash memory, a phase-change RAM (PRAM), a resistive RAM (ReRAM), a ferroelectric RAM (FRAM) and/or a spin torque transfer magnetic RAM (STT-MRAM).

The controller 6120 and the memory device 6130 may be integrated into one semiconductor device to form a solid state drive (SSD), or a memory card, such as a PC card (e.g., personal computer memory card international association (PCMCIA)), a compact flash card (CF), a smart media card (e.g., SM and SMC), a memory stick, a multimedia card (e.g., MMC, RS-MMC, MMCmicro and eMMC), a secure digital (SD) card (e.g., SD, miniSD, microSD and SDHC) or a universal flash storage (UFS).

Figure 10:
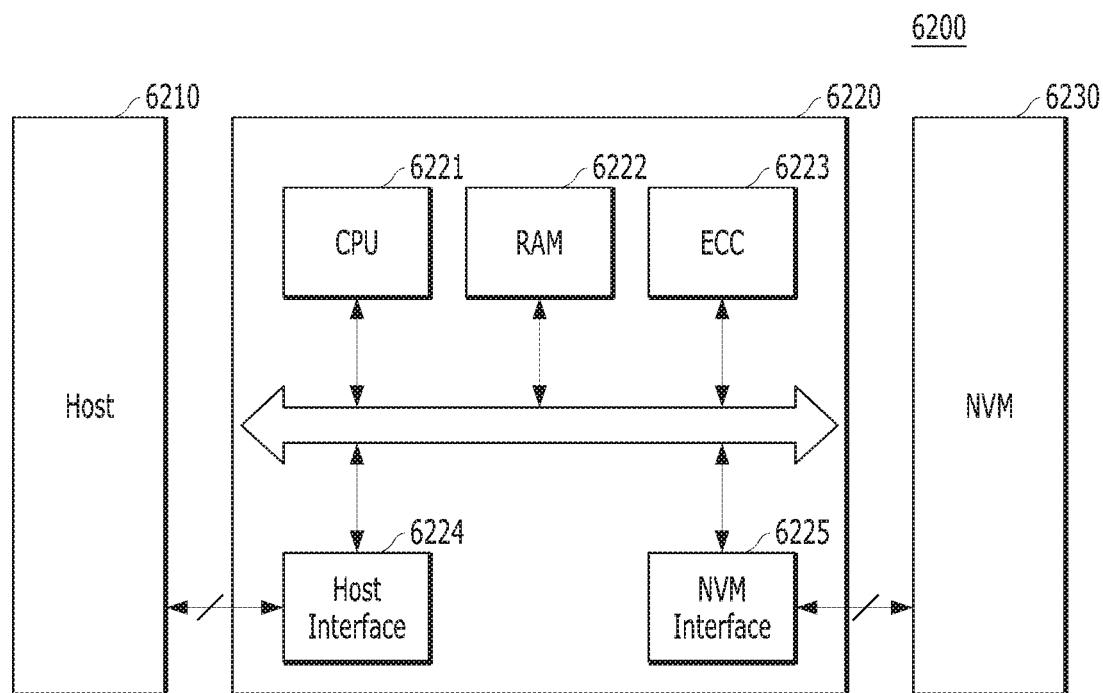

FIG. 10 is a diagram illustrating a data processing system 6200 including a memory system in accordance with an embodiment.

Referring to FIG. 10, the data processing system 6200 includes a memory device 6230 which is implemented by at least one nonvolatile memory (NVM) and a memory controller 6220 which controls the memory device 6230. The data processing system 6200 may be a storage medium, such as a memory card (e.g., CF, SD and microSD). The memory device 6230 may correspond to the memory device 30 in the memory system 110 described above with reference to FIG. 1, and the memory controller 6220 may correspond to the controller 20 in the memory system 110 described above with reference to FIG. 1.

The memory controller 6220 controls read, write and erase operations for the memory device 6230 in response to requests from a host 6210. The memory controller 6220 includes at least one CPU 6221, a buffer memory, for example, a RAM 6222, an ECC circuit 6223, a host interface 6224, and a memory interface, for example, an NVM interface 6225.

The CPU 6221 may control general operations for the memory device 6230, for example, read, write, file system management, bad page management, and the like. The RAM 6222 operates according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 to operate at a higher speed.

The ECC circuit 6223 generates an error correction code (ECC) for correcting a failed bit or an error bit in the data received from the memory device 6230. Also, the ECC circuit 6223 performs error correction encoding for data to be provided to the memory device 6230, and generates data with added parity bits. The parity bits may be stored in the memory device 6230. The ECC circuit 6223 may perform error correction decoding for data outputted from the memory device 6230. The ECC circuit 6223 may correct errors by using the parity bits. For example, the ECC circuit 6223 may correct errors by using various coded modulations, such as an LDPC code, a BCH code, a turbo code, a Reed-Solomon code, a convolution code, an RSC, a TCM and a BCM.

The memory controller 6220 exchanges data with the host 6210 through the host interface 6224, and exchanges data with the memory device 6230 through the NVM interface 6225. The host interface 6224 may be connected with the host 6210 through a PATA bus, a SATA bus, an SCSI, a USB, a PCIe or a NAND interface. Further, as a wireless communication function or a mobile communication protocol such as WiFi or long term evolution (LTE) is implemented, the memory controller 6220 may transmit and receive data by being connected with an external device, for example, the host 6210 or another external device. Specifically, as the memory controller 6220 is configured to communicate with an external device through at least one among various communication protocols, the memory system and the data processing system in accordance with an embodiment may be applied to wired and/or wireless electronic appliances, particularly a mobile electronic appliance.

Figure 11:
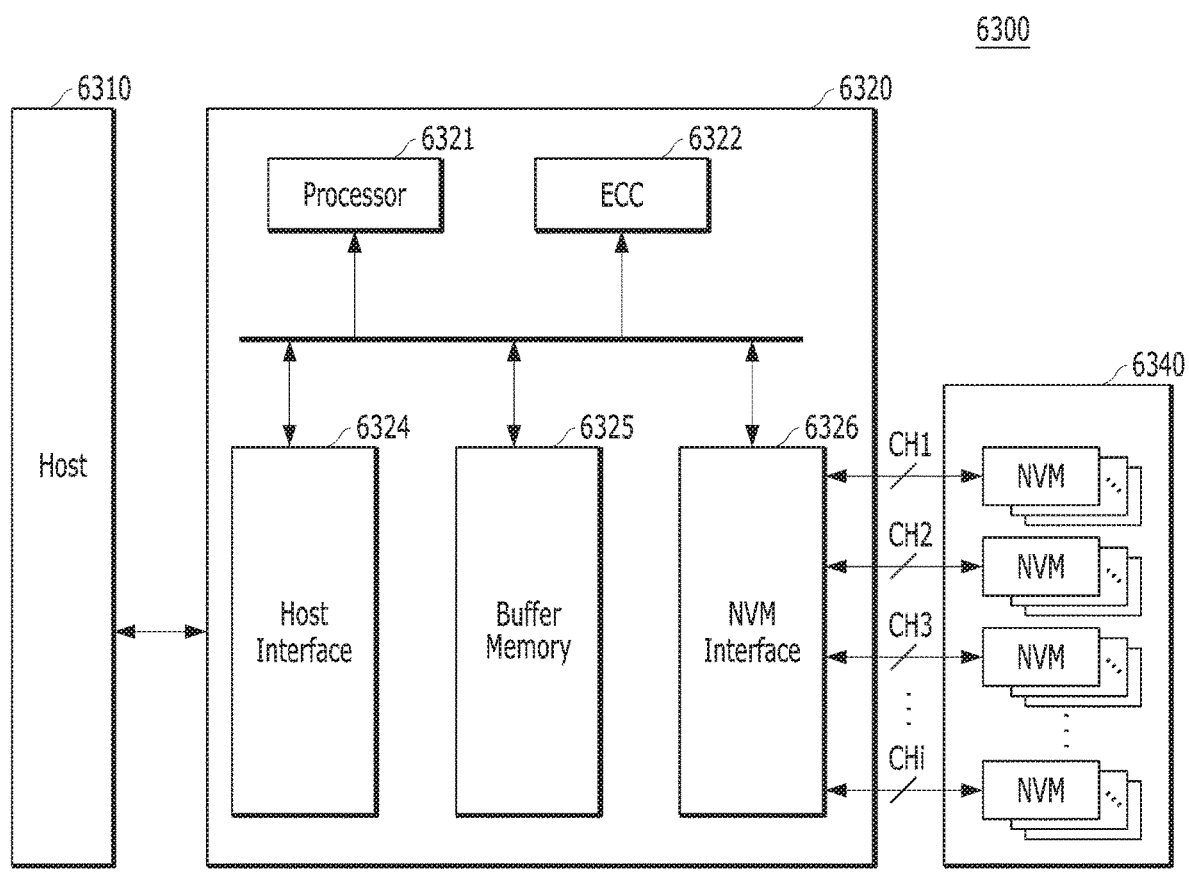

FIG. 11 is a diagram illustrating a data processing system including a memory system in accordance with an embodiment. FIG. 11 illustrates a solid state drive (SSD) 6300 to which the memory system is applied.

Referring to FIG. 11, the SSD 6300 includes a controller 6320 and a memory device 6340 which includes a plurality of nonvolatile memories (NVM). The controller 6320 may correspond to the controller 20 in the memory system 110 described above with reference to FIG. 1, and the memory device 6340 may correspond to the memory device 30 in the memory system 110 described above with reference to FIG. 1.

The controller 6320 is connected with the memory device 6340 through a plurality of channels CH1, CH2, CH3, . . . and CHi. The controller 6320 includes at least one processor 6321, an ECC circuit 6322, a host interface 6324, a buffer memory 6325, and a memory interface, for example, a nonvolatile memory interface 6326.

The buffer memory 6325 temporarily stores data received from a host 6310 or data received from a plurality of flash memories NVMs included in the memory device 6340, or temporarily stores metadata of the plurality of flash memories NVMs, for example, map data including mapping tables. The buffer memory 6325 may be realized by a volatile memory including, but not limited to, a DRAM, an SDRAM, a DDR SDRAM, an LPDDR SDRAM and a GRAM, or a nonvolatile memory including, but not limited to, an FRAM, an ReRAM, an STT-MRAM and a PRAM. While it is illustrated in FIG. 11 that the buffer memory 6325 is disposed inside the controller 6320, the buffer memory 6325 may be disposed external to the controller 6320.

The ECC circuit 6322 calculates error correction code values of data to be programmed in the memory device 6340 in a program operation. The ECC circuit 6322 performs an error correction operation for data read from the memory device 6340, based on the error correction code values, in a read operation. The ECC circuit 6322 performs an error correction operation for data recovered from the memory device 6340 in a recovery operation for failed data.

The host interface 6324 provides an interface function with respect to an external device, for example, the host 6310, and the nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 is applied are used, a data processing system, for example, a redundant array of independent disks (RAID) system may be implemented. In the RAID system, the plurality of SSDs 6300 and a RAID controller for controlling the plurality of SSDs 6300 may be included. In the case of performing a program operation by receiving a write command from the host 6310, the RAID controller may select at least one memory system, that is, at least one SSD 6300, in correspondence to the RAID level information of the received write command received, among a plurality of RAID levels, that is, the plurality of SSDs 6300, and may output data corresponding to the write command to the selected SSD 6300. Also, in the case of performing a read operation by receiving a read command from the host 6310, the RAID controller may select at least one memory system, that is, at least one SSD 6300, in correspondence to the RAID level information of the received read command, among the plurality of RAID levels, that is, the plurality of SSDs 6300, and may provide data outputted from the selected SSD 6300 to the host 6310.

Figure 12:
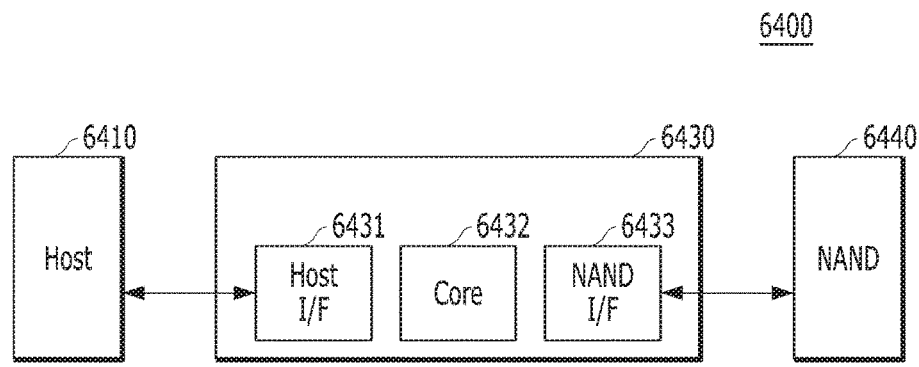
Figure 13:
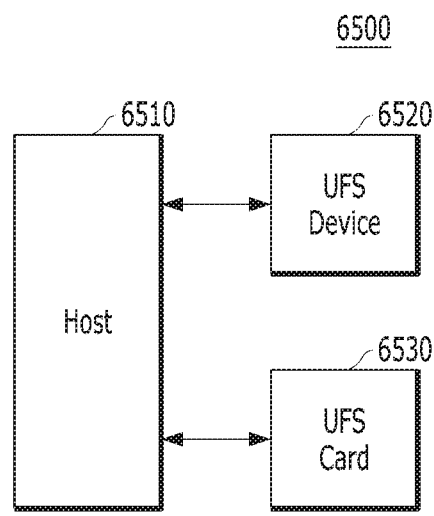

FIG. 12 is a diagram illustrating a data processing system including a memory system in accordance with an embodiment. FIG. 12 illustrates an embedded multimedia card (eMMC) 6400 to which the memory system is applied.

Referring to FIG. 12, the eMMC 6400 includes a controller 6430 and a memory device 6440 which is implemented by at least one NAND flash memory. The controller 6430 may correspond to the controller 20 in the memory system 110 described above with reference to FIG. 1, and the memory device 6440 may correspond to the memory device 30 in the memory system 110 described above with reference to FIG. 1.

The controller 6430 is connected with the memory device 6440 through a plurality of channels. The controller 6430 includes at least one core 6432, a host interface (I/F) 6431, and a memory interface, i.e., a NAND interface (I/F) 6433.

The core 6432 controls general operations of the eMMC 6400. The host interface 6431 provides an interface function between the controller 6430 and a host 6410. The NAND interface 6433 provides an interface function between the memory device 6440 and the controller 6430. For example, the host interface 6431 may be a parallel interface, for example, an MMC interface, as described above with reference to FIG. 1, and may be a serial interface, for example, an ultra high speed (UHS)-I/UHS-II and/or a UFS interface.

FIGS. 13 to 16 are diagrams illustrating examples of data processing systems including a memory system in accordance with embodiments. Each of FIGS. 13 to 16 illustrates a universal flash storage (UFS) to which the memory system is applied.

Referring to FIGS. 13 to 16, respective UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The respective hosts 6510, 6610, 6710 and 6810 may be wired and/or wireless electronic appliances, in particular, application processors of mobile electronic appliances or the likes. The respective UFS devices 6520, 6620, 6720 and 6820 may be embedded UFS devices. The respective UFS cards 6530, 6630, 6730 and 6830 may be external embedded UFS devices or removable UFS cards.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with external devices, for example, wired and/or wireless electronic appliances, in particular, mobile electronic appliances or the like, through UFS protocols. The UFS devices 6520, 6620, 6720 and 6820 and the UFS cards 6530, 6630, 6730 and 6830 may be implemented as the memory system 110 described above with reference to FIG. 1. For example, in the respective UFS systems 6500, 6600, 6700 and 6800, the UFS devices 6520, 6620, 6720 and 6820 may be implemented in the form of the data processing system 6200, the SSD 6300 or the eMMC 6400 described above with reference to FIGS. 13 to 15, and the UFS cards 6530, 6630, 6730 and 6830 may be implemented in the form of the memory card system 6100 described above with reference to FIG. 9.

In the respective UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may perform communication through the universal flash storage (UFS) interface, for example, MIPI M-PHY and MIPI Unified Protocol (UniPro) in Mobile Industry Processor Interface (MIPI). The UFS devices 6520, 6620, 6720 and 6820 and the UFS cards 6530, 6630, 6730 and 6830 may perform communication through another protocol other than the UFS protocol, for example, any of various card protocols, such as universal storage bus (USB) Flash Drives (UFDs), multi-media card (MMC), secure digital (SD), mini SD and Micro SD.

Figure 16:
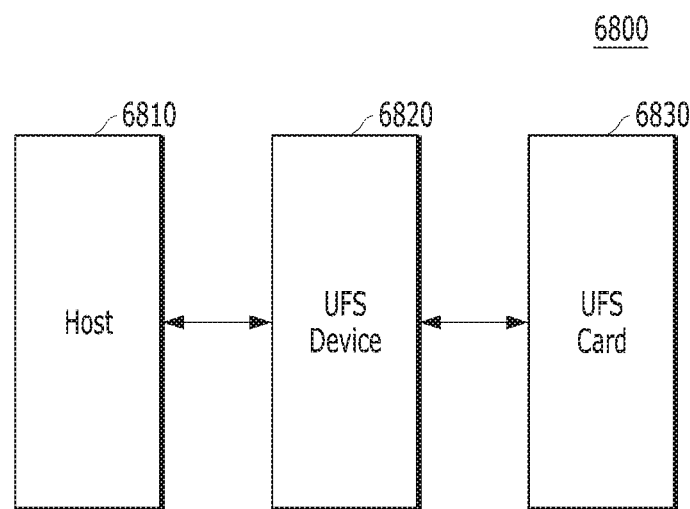

In the UFS system 6500 shown in FIG. 16, UniPro exists in each of the host 6510, the UFS device 6520 and the UFS card 6530. The host 6510 performs a switching operation to perform communication with each of the UFS device 6520 and the UFS card 6530. In particular, the host 6510 performs communication with the UFS device 6520 or the UFS card 6530, through link layer switching in UniPro, for example, L3 switching. The UFS device 6520 and the UFS card 6530 may perform communication through link layer switching in the UniPro of the host 6510. While it is described as an example that one UFS device 6520 and one UFS card 6530 are coupled to the host 6510, it is noted that a plurality of UFS devices and a plurality of UFS cards may be coupled to the host 6510 in a parallel or a star type arrangement. Also, a plurality of UFS cards may be coupled to the UFS device 6520 in any of a parallel, a star, a serial or a chain type arrangement.

Figure 14:
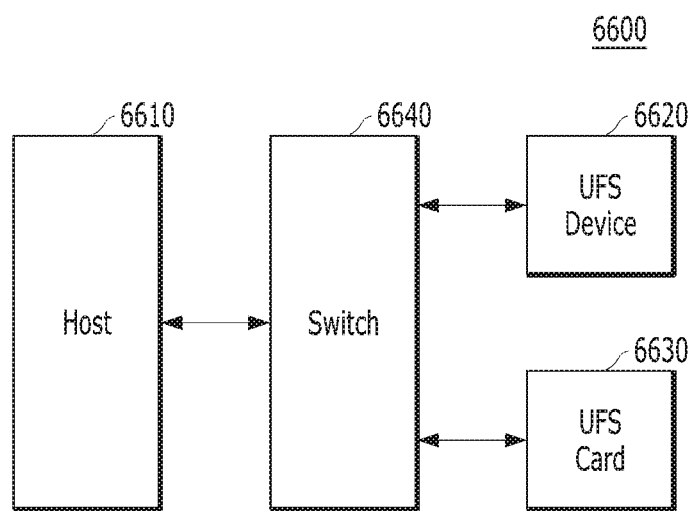

In the UFS system 6600 shown in FIG. 14, UniPro exists in each of the host 6610, the UFS device 6620 and the UFS card 6630. The host 6610 performs communication with the UFS device 6620 or the UFS card 6630 through a switching circuitry 6640 which performs a switching operation, in particular, a switching circuitry 6640 which performs link layer switching in UniPro, for example, an L3 switching operation. The UFS device 6620 and the UFS card 6630 may perform communication through link layer switching in the UniPro of the switching circuitry 6640. While it is described as an example that one UFS device 6620 and one UFS card 6630 are coupled to the switching circuitry 6640, it is noted that a plurality of UFS devices and a plurality of UFS cards may be coupled to the switching circuitry 6640 in a parallel type or a star type arrangement. Also, a plurality of UFS cards may be coupled to the UFS device 6620 in any of a parallel, a star, a serial or a chain type arrangement.

Figure 15:
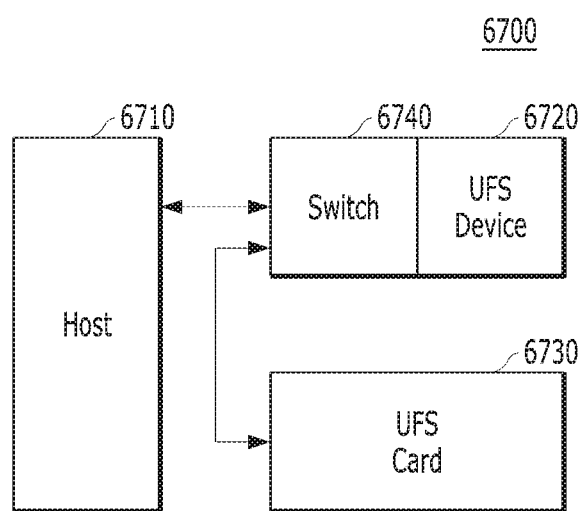

In the UFS system 6700 shown in FIG. 15, UniPro exists in each of the host 6710, the UFS device 6720 and the UFS card 6730. The host 6710 performs communication with the UFS device 6720 or the UFS card 6730 through a switching circuitry 6740 which performs a switching operation, in particular, the switching circuitry 6740 which performs link layer switching in UniPro, for example, an L3 switching operation. The UFS device 6720 and the UFS card 6730 may perform communication through link layer switching in the UniPro of the switching circuitry 6740. The switching circuitry 6740 may be implemented as one circuitry with the UFS device 6720 inside or outside the UFS device 6720. While it is described as an example that one UFS device 6720 and one UFS card 6730 are coupled to the switching circuitry 6740, it is noted that a plurality of circuitrys in which the switching circuitry 6740 and the UFS device 6720 are respectively implemented may be coupled to the host 6710 in a parallel type or a star type arrangement. Also, respective circuitrys may be coupled in a serial type or a chain type arrangement, or a plurality of UFS cards may be coupled to the switching circuitry 6740 in a parallel type or a star type arrangement.

In the UFS system 6800 shown in FIG. 16, M-PHY and UniPro exist in each of the host 6810, the UFS device 6820 and the UFS card 6830. The UFS device 6820 performs a switching operation to perform communication with the host 6810 and the UFS card 6830. In particular, the UFS device 6820 performs communication with the host 6810 or the UFS card 6830, through switching between M-PHY and UniPro circuitrys for communication with the host 6810 and M-PHY and UniPro circuitrys for communication with the UFS card 6830, for example, target identifier (ID) switching. The host 6810 and the UFS card 6830 may perform communication through target ID switching between M-PHY and UniPro circuitrys of the UFS device 6820. While it is described as an example that one UFS device 6820 is coupled to the host 6810 and one UFS card 6830 is coupled to one UFS device 6820, it is noted that a plurality of UFS devices may be coupled to the host 6810 in a parallel type or a star type arrangement. Also, a plurality of UFS cards may be coupled to one UFS device 6820 in any of a parallel, a star, a serial, or a chain type arrangement.

Figure 17:
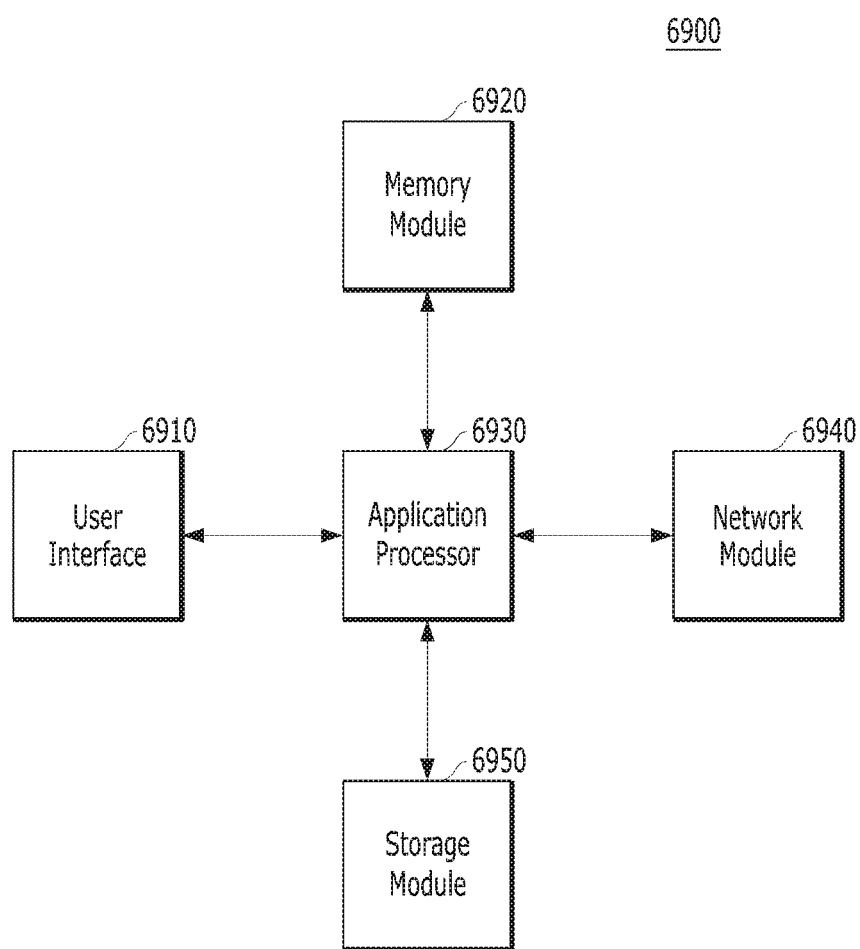

FIG. 17 is a diagram illustrating a data processing system including a memory system in accordance with an embodiment. FIG. 17 illustrates a user system 6900 to which the memory system is applied.

Referring to FIG. 17, the user system 6900 includes a user interface 6910, a memory circuitry 6920, an application processor 6930, a network circuitry 6940, and a storage circuitry 6950.

The application processor 6930 drives components included in the user system 6900 and an operating system (OS). For example, the application processor 6930 may include controllers for controlling the components included in the user system 6900, interfaces, graphics engines, and other components. The application processor 6930 may be provided as a system-on-chip (SoC).

The memory circuitry 6920 may operate as a main memory, a working memory, a buffer memory or a cache memory of the user system 6900. The memory circuitry 6920 may include a volatile random access memory, such as a DRAM, an SDRAM, a DDR SDRAM, a DDR2 SDRAM, a DDR3 SDRAM, an LPDDR SDRAM, an LPDDR2 SDRAM and/or an LPDDR3 SDRAM, or a nonvolatile random access memory, such as a PRAM, an ReRAM, an MRAM and/or an FRAM. For example, the application processor 6930 and the memory circuitry 6920 may be mounted as a package-on-package (PoP).

The network circuitry 6940 may communicate with external devices. For example, the network circuitry 6940 may support not only wired communications but also various wireless communications, such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), and the like, and may thereby communicate with wired and/or wireless electronic appliances, particularly a mobile electronic appliance. As a result, the memory system and the data processing system may be applied to wired and/or wireless electronic appliances. The network circuitry 6940 may be included in the application processor 6930.

The storage circuitry 6950 may store data, for example, data received from the application processor 6930, and transmit data stored therein to the application processor 6930. The storage circuitry 6950 may be implemented by any of a nonvolatile memory, such as a phase-change RAM (PRAM), a magnetic RAM (MRAM), a resistive RAM (ReRAM), a NAND flash memory, a NOR flash memory and a 3-dimensional NAND flash memory. Also, the storage circuitry 6900 may be provided as a removable storage medium such as a memory card of the user system 6900 or an external drive. That is to say, the storage circuitry 6950 may correspond to the memory system 110 described above with reference to FIG. and may be implemented as the SSD, eMMC and UFS described above with reference to FIGS. 11 to 16.

The user interface 6910 may include interfaces for inputting data or commands to the application processor 6930 or for outputting data to an external device. For example, the user interface 6910 may include user input interfaces, such as a keyboard, a keypad, a button, a touch panel, a touch screen, a touch pad, a touch ball, a camera, a microphone, a gyroscope sensor, a vibration sensor and a piezoelectric element, and user output interfaces, such as a liquid crystal display (LCD), an organic light emitting diode (OLED) display device, an active matrix OLED (AMOLED) display device, an LED, a speaker and a motor.

In the case where the memory system 110 described above with reference to FIG. 1 is applied to the mobile electronic appliance of the user system 6900 in accordance with an embodiment, the application processor 6930 controls general operations of the mobile electronic appliance, and the network circuitry 6940 as a communication circuitry controls wired and/or wireless communication with an external device, as described above. The user interface 6910 as the display and touch circuitry of the mobile electronic appliance displays data processed by the application processor 6930 or supports input of data from a touch panel.

According to embodiments of the present invention, the memory system and the method for operating the memory system is configured to determine whether to generate a dummy page, using a real time clock (RTC), and thus minimize the consumption of free pages.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A memory system comprising:
    a memory device comprising a plurality of memory blocks; and
    a controller suitable for controlling the memory device, wherein the controller comprises:
    a real time clock (RTC) management circuitry suitable for generating a sudden power-off (SPO) occurrence cycle using first and second RTC values when a first SPO occurs, and then comparing the SPO occurrence cycle to a threshold value to determine whether to delay dummy page generation; and
    a dummy page generation circuitry suitable for generating a dummy page using one or more free pages or an incomplete program page, excluding valid pages, from a memory block, among the plurality of memory blocks, according to the determination result of the RTC manager, the incomplete program page indicating a page in which a program operation is interrupted due to an SPO.

2. The memory system of claim 1, wherein the first RTC value indicates an SPO occurrence time, which is generated before the first SPO, the first RTC value being stored in a list that stores one or more RTC values, each of which indicates a corresponding SPO generation time and is generated before a corresponding SPO occurs.

3. The memory system of claim 1, wherein the RTC management circuitry comprises a first RTC load circuitry suitable for deciding whether operations are to be performed in a first or second mode, depending on a result obtained by determining whether the first RTC value is loaded from a list.

4. The memory system of claim 3, wherein the first RTC load circuitry decides the first mode of operation when the first RTC value is not present in the list, and decides the second mode of operation when the first RTC value is present in the list.

5. The memory system of claim 4, further comprising a second RTC generation circuitry suitable for receiving a booting time value from a host in the case that the memory system is powered on and generating a second RTC value indicating a first SPO occurrence time using the booting time value, when the first mode of operation is decided.

6. The memory system of claim 4, further comprising:
   a second RTC generation circuitry; a comparison circuitry; and a time delay circuitry; wherein when the second mode of operation is decided
   the second RTC generation circuitry receives a booting time value from a host when the memory system is powered on, and generates a second RTC value indicating a first SPO occurrence time using the booting time value;
   the comparison circuitry compares the SPO occurrence cycle to a threshold value and determines whether a second SPO is likely to occur, the SPO occurrence cycle being calculated through a difference between the first RTC value received through the first RTC load circuitry and the second RTC value generated through the second RTC generation circuitry; and
   the time delay circuitry delays a dummy page generation time by a first delay time, when the comparison result between the SPO occurrence cycle and the threshold value indicates that the SPO occurrence cycle is less than the threshold value.

7. The memory system of claim 6, wherein, when the comparison result between the SPO occurrence cycle and the threshold value indicates that the SPO occurrence cycle is greater than the threshold value, the dummy page is generated through the dummy page generator.

8. An operating method of a memory system which includes a memory device including a plurality of memory blocks and a controller suitable for controlling the memory device, the operating method comprising:
   generating a sudden power-off (SPO) occurrence cycle using first and second real time clock (RTC) values when a first SPO occurs, and comparing the SPO occurrence cycle to a threshold value to determine whether to delay dummy page generation; and
   generating a dummy page using one or more free pages or an incomplete program page, excluding valid pages, from a memory block, among the plurality of memory blocks, according to the result of the determining of whether to delay dummy page generation, the incomplete program page indicating a page in which a program operation is interrupted due to an SPO.

9. The operating method of claim 8, wherein the first RTC value indicates an SPO occurrence time, which is generated before the first SPO, the first RTC value being stored in a list that stores one or more RTC values, each of which indicates a corresponding SPO generation time and is generated before a corresponding SPO occurs.

10. The operating method of claim 8, further comprising deciding whether operations are to be performed in a first or second mode, depending on whether the first RTC value is loaded from a list.

11. The operating method of claim 10, wherein the first mode of operation indicates a case in which the first RTC value is not present in the list.

12. The operating method of claim 11, wherein the first mode comprises receiving a booting time value from a host when the memory system is powered on, and generating a second RTC value indicating a first SPO occurrence time using the booting time value.

13. The operating method of claim 10, wherein the second mode of operation indicates that the first RTC value is present in the list.

14. The operating method of claim 13, wherein the second mode of operation comprises:
   receiving a booting time value from the host when the memory system is powered on, and generating a second RTC value indicating a first SPO occurrence time using the booting time value;
   comparing an SPO occurrence cycle to a threshold value and determining whether a second SPO is likely to occur, the SPO occurrence cycle being calculated through a difference between the first RTC value and the second RTC value; and
   delaying a dummy page generation time, when the comparison result indicates that the SPO occurrence cycle is less than the threshold value.

15. The operating method of claim 14, further comprising generating the dummy page by performing a dummy program operation to program one or more pages with dummy data, when the comparison result indicates that the SPO occurrence cycle is greater than the threshold value.

16. A memory system comprising one or more storage devices including one or more processors and a program command executed by at least one of the one or more processors,
   wherein the one or more storage devices and the program command control the memory system and the one or more processors to:
   generate a sudden power-off (SPO) occurrence cycle using first and second real time clock (RTC) values when a first SPO occurs;
   compare the SPO occurrence cycle to a threshold value;
   delay a dummy page generation time by a first delay time, when the comparison result between the SPO occurrence cycle and the threshold value indicates that the SPO occurrence cycle is less than the threshold value; and
   generate a dummy page, after the first delay time has elapsed, using one or more free pages or an incomplete program page, excluding valid pages, from a memory block, the incomplete program page indicating a page in which a program operation is interrupted due to an SPO.

17. The memory system of claim 16, wherein, when the comparison result between the SPO occurrence cycle and the threshold value indicates that the SPO occurrence cycle is greater than the threshold value, generating the dummy page, without delaying the dummy page generation time.

* * * * *